United States Patent
Saito et al.

(10) Patent No.: US 6,202,168 B1
(45) Date of Patent: Mar. 13, 2001

(54) DEVICE FOR REGULATING VARIATION OF DELAY TIME FOR DATA TRANSFER BETWEEN LOGIC CIRCUITS

(75) Inventors: Tatsuya Saito, Hachioji; Tetsuya Umemura, Sayama; Hiroki Yamashita, Hachioji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/113,332

(22) Filed: Jul. 10, 1998

(30) Foreign Application Priority Data

Jul. 11, 1997 (JP) .................................... 9-186249

(51) Int. Cl.[7] ................ G06F 1/04; G06F 1/12; G06F 5/06; G06F 11/00
(52) U.S. Cl. .......................... 713/600; 713/400; 713/503; 713/600
(58) Field of Search ..................................... 713/600, 400, 713/401, 503, 601; 365/194; 327/250; 375/356

(56) References Cited

U.S. PATENT DOCUMENTS

| | | | |
|---|---|---|---|
| 5,471,165 | * 11/1995 | Liedberg ............................... | 327/250 |
| 5,717,729 | * 2/1998 | Iknaian et al. ........................ | 375/356 |
| 5,768,570 | * 6/1998 | Kobayashi et al. ................... | 713/401 |
| 5,917,762 | * 6/1999 | Zheng et al. .......................... | 365/194 |
| 5,933,623 | * 8/1999 | Umemura et al. .................... | 713/400 |
| 5,978,929 | * 11/1999 | Covino et al. ........................ | 713/600 |
| 6,020,773 | * 2/2000 | Kan et al. ............................. | 327/271 |
| 6,023,768 | * 2/2000 | Shafer .................................. | 713/600 |

OTHER PUBLICATIONS

C. Gleason et al, VLSI Circuits for Low–End and Midrange PA–RISC Computers, Hewlett–Packard Journal, Aug. 1992.

* cited by examiner

Primary Examiner—Thomas C. Lee
Assistant Examiner—Chun Cao
(74) Attorney, Agent, or Firm—Mattingly, Stanger & Malur, P.C.

(57) ABSTRACT

The delay time for the transfer of data signals between pluralities of logic circuits is automatically regulated to be in a desired range. In order to regulate the delay time of the data signal transfer, a common standard signal SYNC is distributed to the logic circuits from a standard signal generator source. In the sending side of one logic circuit, the standard signal is applied through a selector circuit to a flip-flop circuit and then transferred to the receiving side of another logic circuit. Specifically, the transferred standard signal passes through a variable delay circuit to a flip flop circuit on the receiving side of the other logic circuit where it is compared with the standard signal received from the standard signal generator source, which has passed through a delay circuit of a standard delay value. The result of the comparison is used to adjust the variable delay circuit that controls the delay time for the transferred standard signal. Once the variable delay circuit is adjusted with the standard signal, the selector selects normal data signals for transfer between the logic circuits with the appropriate delay. The standard signal can also be used to synchronize the generation of test pattern signals generated in each of the logic circuits.

8 Claims, 8 Drawing Sheets

DEVICE FOR REGULATING VARIATION OF DELAY TIME FOR DATA TRANSFER BETWEEN LOGIC CIRCUITS

BACKGROUND OF THE INVENTION

1. Field of the Invention

The present invention relates to a method for transferring a data signal between pluralities of logic circuits. More specifically, the present invention relates to a method of regulating the delay time of a transferred data signal between the logic circuits.

2. Description of the Related Art

In a logic device, such as a computer, the operation of logic circuits involves sending and/or receiving data signals between the logic circuits in synchronism with a system clock signal. In order for those logic circuits to operate normally, it is necessary for the transferred data signal to reach the designated logic circuit within a predetermined time.

FIG. 6 is a diagram of a logic circuit of the prior art in which a data signal is transferred between the logic circuits. As shown, there is a logic circuit 601 on the sending side and a logic circuit 602 on the receiving side. The logic circuits 601 and 602 are formed in an integrated circuit. The logic circuit 601 includes a flip-flop circuit 603 and a driver circuit for signal transfer 604. The logic circuit 602 includes a transferred signal input circuit 606 and a flip-flop circuit 608. There is a signal transferring circuit 605 between the logic circuits 601 and 602. The system clock signal (CLK) is supplied from a common clock signal source 609 to the flip-flop circuit 603 of the logic circuit 601, the flip-flop circuit 608 of the logic circuit 602, and the data signal is transferred in synchronism with the system clock signal (CLK).

FIG. 7 is a timing chart showing the timing of the signals associated with the data transfer between the logic circuits 601 and 602 of FIG. 6. Signal CLK is the system clock signal, signal Q1 is an output signal of the flip-flop circuit 603, signal OUT is an output signal of output circuit 604, signal IN is an input signal of input circuit 606, signal D2 is an input signal of the flip-flop circuit 608 and signal Q2 is an output signal of the flip-flop circuit 608.

With reference to FIG. 7, the design objective is to output signal Q2 from the flip flop circuit 608 three cycles of the system clock after signal Q1 is output from the flip-flop circuit 603. In the figure, the system clock cycle is Tck and the delay time from the signal Q1 to the signal D2 is Td. The desired delay time of the circuits 603, 604, 605 and 606 may be expressed by equation (1).

$$2Tck < Td \leq 3Tck \quad (1)$$

However, if the delay time of the circuits 603, 604 and 606 and the delay time of the wiring circuitry used for the circuit 605 vary, for example due to the deviations in the manufacturing processes for the respective circuits, a difficulty occurs in the normal transfer of data signals because equation (1) is not satisfied.

FIG. 8 shows an example of a case in which the delay time of the circuits and wiring, etc. varies by ΔTd in the direction of decreasing the delay time for the respective circuits. As another example, the delay time could be varied by ΔTd in the direction of increasing the delay time, although only the decreasing delay time example is shown in the figure. To solve the above problem, it is necessary to measure the delay time Td for all elements affecting the data signal transfer and regulate the delay time Td to satisfy equation (1). However, this objective is impractical to realize because normal logic devices have a great number of signal lines which would need to be regulated.

One attempt for solving such prior art problems related to the difficulty of accomplishing normal data transfer due to the variations in data transfer time between logic circuits is disclosed, for example, in the HP Journal, August 1992, page 14. In the article, a method is disclosed for transferring a clock signal from a logic circuit on a sending side to a logic circuit on a receiving side in parallel with a transferred data signal.

FIG. 9 is a circuit diagram showing the configuration of a clock signal parallel transfer method used in the prior art and includes a logic circuit 901 on the sending side and a logic circuit 902 on the receiving side. Logic circuit 901 includes a flip-flop circuit 903 and a driver circuit for signal transfer 904. Logic circuit 902 includes a transferred signal input circuit 906 and a flip-flop circuit 908. There is a signal transferring circuit 905 between the logic circuits 901 and 902.

The logic circuit 901 includes an SCLK driver circuit 910 for sending an output signal SCLK in synchronism with a system clock signal through a transferring circuit SCLK 911. SCLK transfer circuit 911 is installed in parallel with the signal transferring circuit 905 and a clock signal SCLK exclusively used for transferring is sent to an input circuit SCLK 912 in the logic circuit 902. The system clock signal (CLK) is supplied from a common clock signal source 909 to the flip-flop circuit 903, which sends the data signal in synchronism with the system clock signal (CLK). The signal SCLK is supplied to the flip-flop circuit 908, which receives the data signal in synchronism with the clock signal (SCLK).

FIG. 10 is a timing chart showing the timing of the signals associated with the data transfer according to the clock parallel transfer method employed in FIG. 9. Signal CLK is the system clock signal, signal Q1 is an output signal of the flip-flop circuit 903, signal OUT is an output signal of an output circuit 904, signal IN is an input signal of an input circuit 906, signal D2 is an input signal of the flip-flop circuit 908, signal Q2 is an output signal of the circuit 908 and signal SCLK is a clock signal exclusively used for transferring which is supplied to the flip-flop circuit 908.

In the timing chart using the clock parallel transfer method as shown in FIG. 10, the delay time Td from the signal Q1 to the signal D2 and the delay value of the delay time Tdck from the system clock signal CLK to the clock signal exclusively used for transferring (SCLK) would be equal as specified in equation (2) because the signal transferring circuit 905 is in parallel with the transferring circuit for SCLK 911.

$$Tdck = Td \quad (2)$$

According to the clock parallel transfer method employed in FIG. 9, even if the delay time used for the circuits 903, 904, 906, 910 and 912 and the delay time used for the circuits 905 and 911 vary based upon deviations in the process of the manufacturing of the respective circuits, equation (2) can be satisfied because the delay time of the respective circuits vary in the same direction. Consequently, the delay time of the circuits 903, 904, 905, 906, 910, 911 and 912 can be designed to satisfy equation (2) so as to perform the data transfer between the logic circuits based upon the above method.

SUMMARY OF THE INVENTION

However, in the prior art clock parallel transfer method employed in the arrangement of FIG. 9, a problem occurs in that the delay value of the delay time Tdck of the clock signal, used exclusively for transferring, has to be regulated to a fixed cycle in order to achieve a predetermined time difference between a signal sent from the logic circuit on the sending side and a signal reaching the logic circuit on the receiving side, which is within the range of a fixed system clock cycle.

For example, in FIGS. 9 and 10, in order to output signal Q2 three cycles after signal Q1 is output from the flip-flop circuit 903, it is necessary to regulate the delay time of the driver circuit 910, the transferring circuit 911 and the input circuit 912 so that an equation (3) can be satisfied.

$$2Tck < Tdck \leq 3Tck \quad (3)$$

In other words, in the prior art, although it is unnecessary to regulate the delay time between the data signal transfer time and the SCLK transfer time, the delay time Tdck of the parallel transferred clock signal needs to be regulated so that it controls the data transfer to be within a range of the fixed system clock cycle.

Since a normal logic circuit has a great number of signals to be transferred, it is quite difficult to regulate the number of signals being transferred and the number of parallel transferred clock signals being regulated to a desired range.

Accordingly, an object of the present invention is to address the above mentioned problems in the prior art by providing an arrangement in which the variation of the delay time for the data transfer between logic circuits that send and/or receive data signals in synchronism with a system clock signal can be varied automatically even if the delay time varies due to deviations in the circuits and wiring for the circuits resulting from differences in the manufacturing processes thereof.

Another object of the present invention is to provide for the data transfer to be performed between logic circuits that send and/or receive data signals in synchronism with a system clock so that the data transfer is performed in a range of the system clock cycle without employing the parallel transferred clock signal method of the prior art.

In an arrangement of logic circuits that send and/or receive data signals in synchronism with a system clock signal, the objects of the present invention are accomplished by providing a standard signal source and providing a standard signal to the sending and receiving side of a plurality of logic circuits. On the sending side, the standard signal is transferred to the receiving side with a resultant delay due to the transfer circuitry and wiring and further due to a variable delay that is adjusted by comparing, on the receiving side, the standard signal, which is subject to a standard delay value, to the transferred standard signal that is received by the logic circuit on the receiving side from the logic circuit on the sending side. The result of the comparing is then used to adjust the delay of the variable delay for the transferred standard signal to a desired delay time value, followed by data signal transfer of a data signal with the adjusted delay for normal data signal transfer.

Alternatively, the objects of the present invention are accomplished by regulating the delay time of a transferred signal in an arrangement of logic circuits that send and/or receive data signals in synchronism with a system clock signal, by transferring a first test pattern signal from the sending side to the receiving side of the plurality of logic circuits and comparing the transferred first test pattern signal with a second test pattern signal that is synchronized with the first test pattern signal on the receiving side, wherein the test pattern signals are generated from a standard signal by a common standard signal source. The second test pattern signal is delayed by a standard value delay amount and then compared with the transferred first test pattern signal on the receiving side that is delayed as a result of the signal transfer circuitry and further by a variable delay amount, wherein the result of the comparing adjusts the variable delay amount until the delay of the second test pattern signal is substantially equal to the adjusted delay of the transferred first test pattern signal.

The objects of the invention are further achieved by regulating the delay time of a delay circuit that delays the standard signal or second test pattern signal by the standard value delay amount with a delay circuit to a target value. In a preferred embodiment, the delay circuit is a shift register and the standard signal or test pattern signal is shifted in synchronism with the system clock signal.

BRIEF DESCRIPTION OF THE DRAWINGS

The embodiments of the present invention are described below in conjunction with the figures, in which.

DESCRIPTION OF THE PREFERRED EMBODIMENTS

A description will be given of the embodiments of the present invention by reference to the accompanying drawings.

Figure 1:
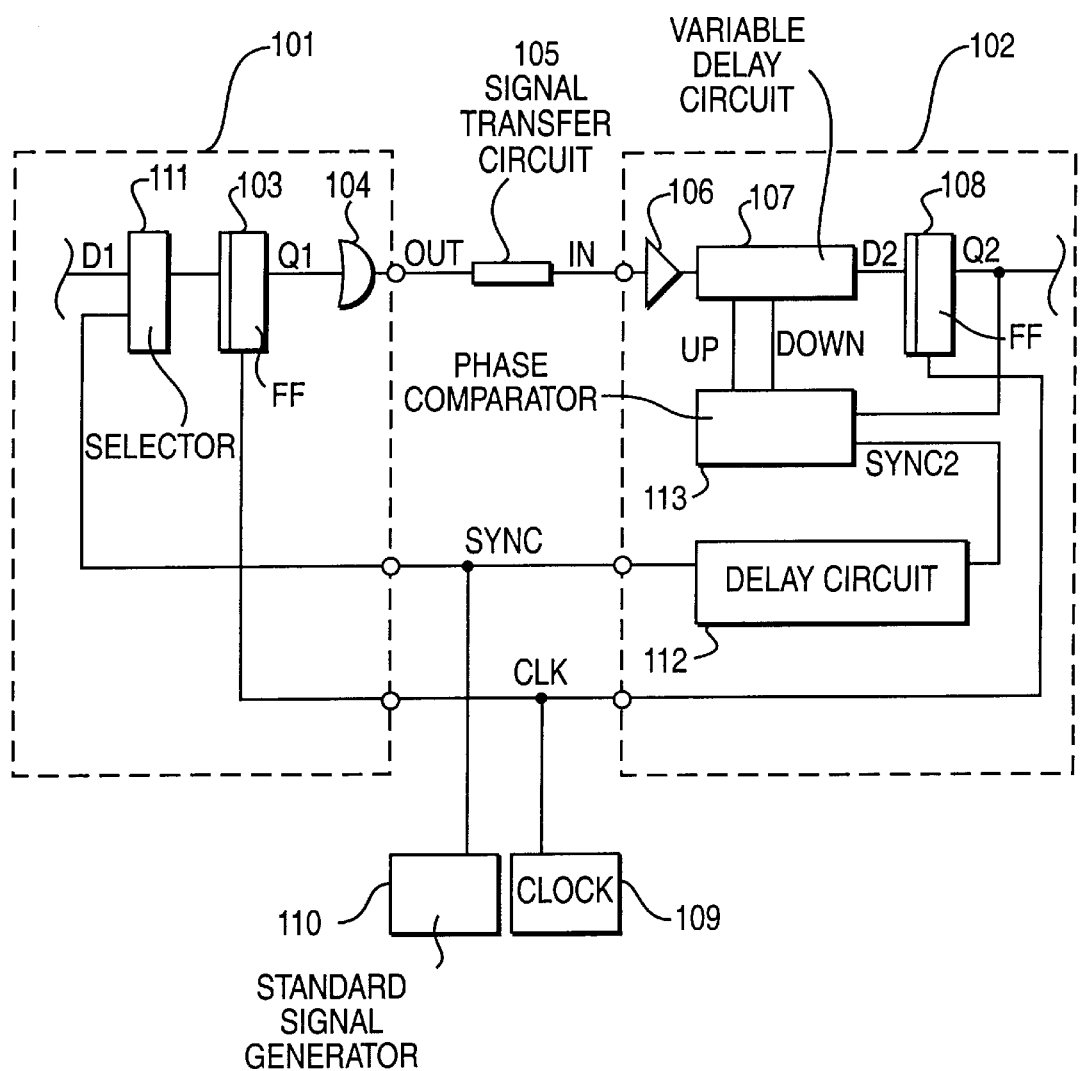
FIG. 1 is a diagram showing data signal transfer between logic circuits according to a first embodiment of the present invention.

FIG. 1 is a diagram showing a first embodiment of a data signal transfer method between logic circuits according to the present invention. Data is transferred from a logic circuit 101 on a sending side to a logic circuit 102 on a receiving side, and in the preferred embodiment, circuits 101 and 102 are in the form of integrated circuits. Logic circuit 101 includes a flip-flop circuit 103 and a driver circuit 104 for signal transfer. The logic circuit 102 includes a transferred signal input circuit 106, a variable delay circuit 107 that adjusts the delay time of the transferred signal and a flip-flop circuit 108. There is a signal transfer circuit 105 between the logic circuits 101 and 102 to transfer the data signal. A system clock signal CLK is supplied from a common clock signal source 109 to the logic circuits 101 and 102 and the flip-flop circuits 103 and 108, and the data signals are transferred in synchronism with the system clock signal.

According to the present invention as shown in FIG. 1, a common standard signal SYNC is distributed from a standard signal generator source 110 to the logic circuits 101 and 102. Standard signal SYNC is used to regulate the delay time of the data signal transfer. The signal SYNC is applied through a selector circuit 111 to the flip-flop circuit 103 and also to delay circuit 112. A standard signal SYNC2 output from delay circuit 112 is received by phase comparator circuit 113 and compared with an output signal Q2 from the flip-flop circuit 108. A comparison result is used to control inputs UP and DOWN of the variable delay circuit 107 to thereby increase or decrease the delay of the data signal transfer between logic circuits 101 and 102.

Figure 2:
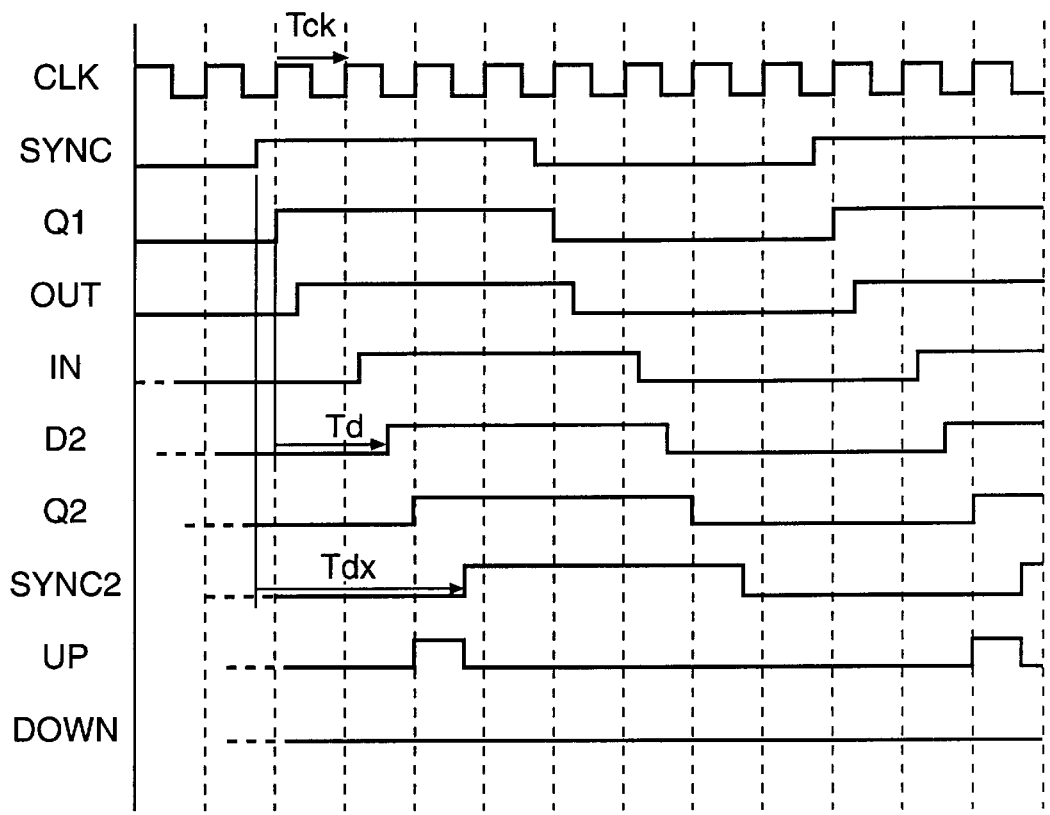
FIG. 2 is a timing chart of the data signal transfer shown in FIG. 1 before regulating the delay time of the data signal transfer.
Figure 3:
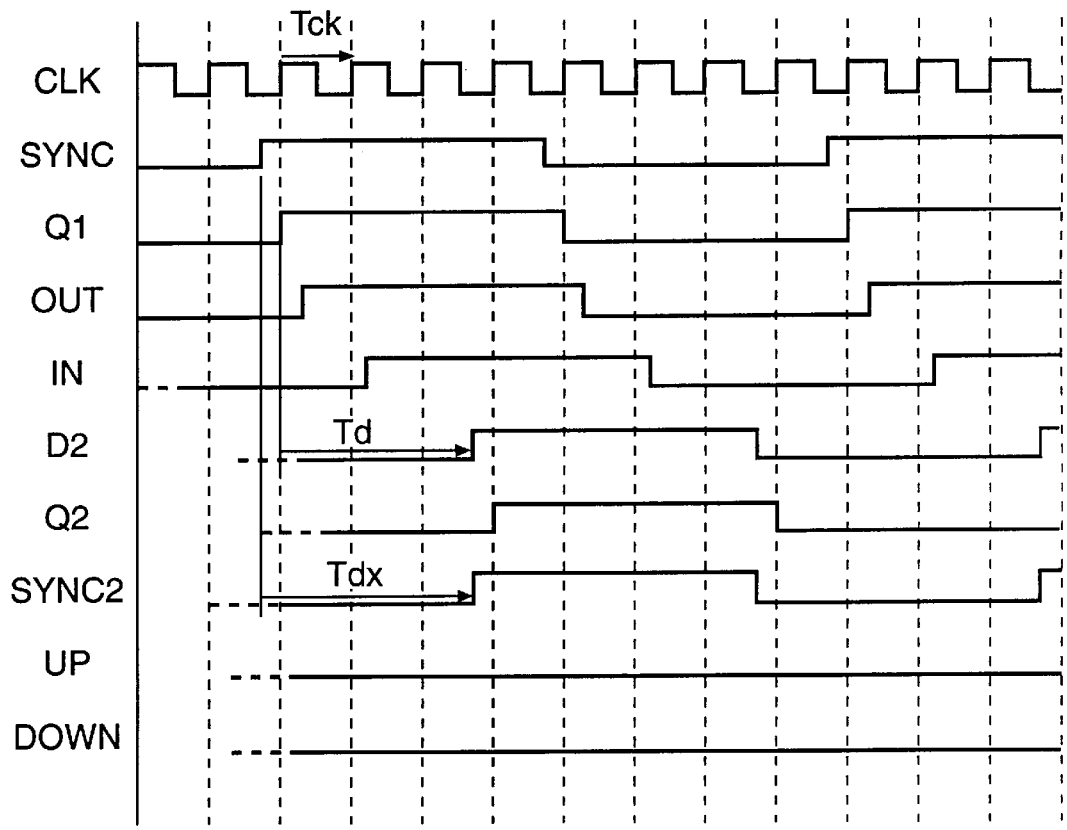
FIG. 3 is a timing chart of the data signal transfer shown in FIG. 1 after the delay time of the data signal transfer has been regulated.

An operation to regulate the variation of the delay time for data signal transfer according to the present invention will now be described. FIG. 2 is a timing chart showing the data signal transfer before regulation and FIG. 3 shows the data signal transfer after regulation. In FIGS. 2 and 3, signal CLK is the system clock signal, signal SYNC is a standard signal, signal Q1 is an output signal of the flip-flop circuit 103, signal OUT is an output signal of an output circuit 104, signal IN is an input signal of an input circuit 106, signal D2 is an input signal of the flip-flop circuit 108, signal Q2 is an output signal of the circuit 108, signal SYNC2 is a standard signal delayed at the delay circuit 112 and signals UP and DOWN are control signals of the variable delay circuit 107.

For regulating the delay in the variable delay circuit 107 to ensure normal data signal transfer, the signal SYNC given to the logic circuit 101 is applied through the selector circuit 111 to the flip-flop circuit 103. The signal SYNC is input to the flip-flop circuit 103 in synchronism with the system clock signal CLK and signal Q1 is generated thereafter. The signal Q1 is then transferred through the output circuit 104 and the signal transferring circuit 105 whereupon it is received by the transferred signal input circuit 106 and the variable delay circuit 107. Then, the signal D2 is input to the flip-flop circuit 108 in synchronism with the system clock CLK. Signal Q2 is output from the flip-flop circuit 108.

The circuit 101 may be equipped with delay circuit 107, 112.

Through the delay circuit 112, the signal SYNC, which becomes the standard signal SYNC2, is delayed by a delay time Tdx of a standard value to regulate the delay time Td for the data signal transfer.

FIG. 2 shows an example wherein the delay time is equal to three cycles of a system clock as the standard value. The standard signal SYNC2 and the signal Q2 are compared at the phase comparator circuit 113. Then, as a result of the comparison, the control signals UP or DOWN (increase or decrease) are used to adjust the delay of variable circuit 107. A control signal UP (increase) its output, for example in FIG. 2 to increase the delay. Based on this control signal (UP), the variable delay circuit 107 regulates the delay time in the direction that the delay time of the data signal transfer Td approaches the delay time of the standard value Tdx. The comparison and the regulation regarding the delay time are repeated until Td becomes equal to Tdx as shown in FIG. 3. After regulation, the selector circuit 111 switches the signal given to the flip-flop circuit 103 to a normal logic signal D1 so that normal data signal transfer can be performed with the necessary delay.

FIGS. 2 and 3 show timing charts useful for designing output signal Q2 to be output 3 cycles of the system clock after the signal Q1 is output from the flip-flop circuit 103. According to this design, if the system clock cycle is Tck and the delay time from outputting signal Q1 at the flip-flop circuit 103 to receiving the data D2 at the flip-flop circuit 108 is Td, an equation (4), which is the same as equation (1) discussed with respect to the prior art, is required to be satisfied.

$$2Tck < Td \leq 3Tck \quad (4)$$

Note in FIG. 2 that equation (4) is not satisfied because of the variation of the delay time of the circuits 103, 104, 105, 106 and 107 has not been compensated. To regulate this variation in the present invention, it is necessary for the delay time of the standard value Tdx of the delay circuit 112 to be designed to satisfy the requirement of equation (5).

$$2Tck < Tdx \leq 3Tck \quad (5)$$

The comparison and regulation regarding the delay time of the signal transfer as mentioned previously is therefore done by designing the delay circuit 112 to regulate the delay time of the standard value Tdx so that the equation (5) can be satisfied. As a result, an equation (6) is satisfied as shown in FIG. 3. Based upon equations (5) and (6), the delay time Td can satisfy the requirement of equation (4).

$$Td = Tdx \quad (6)$$

As mentioned above, since the delay time Td accords with the delay time of the standard value Tdx as indicated by equation (6), by employing the logic circuit arrangement of the present invention, if the delay time of the standard value Tdx is designed in advance to be in a range of a desired system clock cycle as indicated in equation (5), it is possible to regulate the delay time Td automatically in a desired range so that the equation (4) can be satisfied and to realize normal data transfer even if the delay time Td varies due to deviations in the devices resulting from differences in their respective manufacturing processes.

Figure 4:
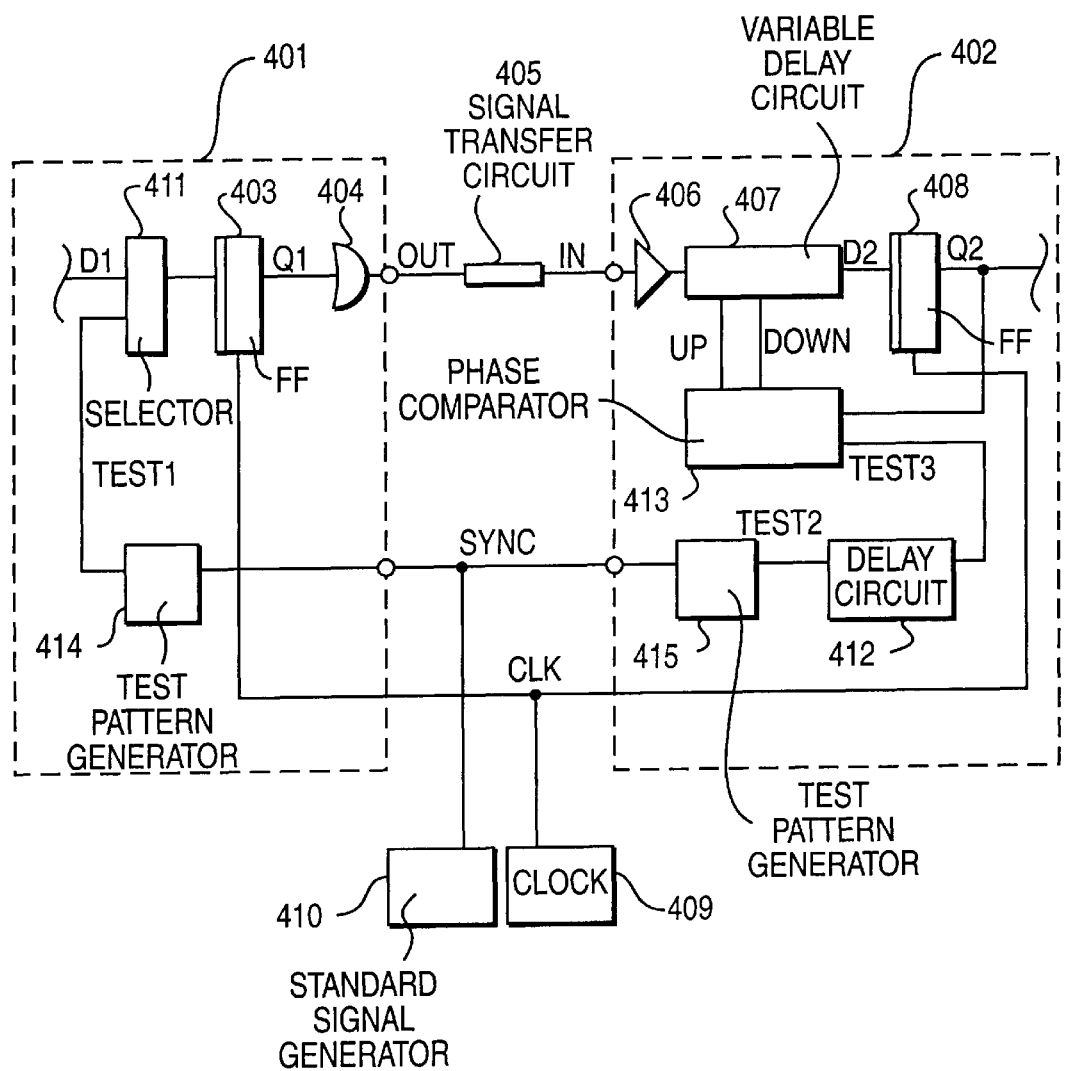
FIG. 4 is a diagram showing data signal transfer between logic circuits according to a second embodiment of the present invention.

FIG. 4 shows a second embodiment of the present invention. In the first embodiment shown in FIG. 1, the regulation of the data transfer time is performed by transferring the signal SYNC from the logic circuit 101 on the sending side to the logic circuit 102 on the receiving side and by comparing the signal SYNC2 from the delay circuit 112 with the output signal Q2 from the flip-flop circuit 108. However, in the second embodiment as shown in FIG. 4, regulation of the data transfer time is performed by comparing a test pattern signal with a signal resulting from sending the test pattern signal generated at the logic circuit 401 on the sending side to the logic circuit 402 on the receiving side. The logic circuits on both the sending and receiving side include test pattern generator circuits 414 and 415, respectively, that generate the test pattern signal. A common standard signal SYNC is used for initializing the test pattern generator circuits on the sending and receiving sides and is synchronized with the generated test pattern signal.

FIG. 4 includes a logic circuit 401 on the sending side and a logic circuit 402 on the receiving side and shows an embodiment of the circuits 401, 402 in the form of integrated circuits. The logic circuit 401 includes a flip-flop circuit 403 and a driver circuit 404 for signal transfer. The logic circuit 402 includes a transferred signal input circuit 406, a variable delay circuit T1 that adjusts the delay time of the transferred signal 407 and a flip-flop circuit 408. There is a signal transferring circuit 405 between the logic circuits 401 and 402. A system clock signal CLK is supplied from a common clock signal source 409 to the logic circuits 401 and 402 and in particular to the flip-flop circuits 403 and 408. The signal is transferred in synchronism with the system clock signal CLK.

According to the present invention as shown in FIG. 4, the generated test pattern signal is initialized and the test pattern generator circuits 414 and 415 are synchronized with the common standard signal SYNC distributed from a standard signal generator source 410. The circuits 414 and 415 generate the test pattern signal for regulating the delay time of the data signal transfer. A test pattern signal TEST 1 is generated by the test pattern generator circuit 414 on the sending side and is applied through a selector circuit 411 to the flip-flop circuit 403. A test pattern signal TEST2 is generated by the test pattern generator circuit 415 on the receiving side and is applied through a delay circuit 412 to a pattern comparator circuit 413 as one of the input signals (standard pattern signal TEST3). Then, the signal TEST3 is compared with an output signal Q2 received from the flip-flop circuit 408. The result of the comparison controls the inputs UP or DOWN (increase or decrease delay) of the variable delay circuit 407.

The logic circuit as shown in FIG. 4 operates as well as the logic circuit of the first embodiment shown in FIG. 1. Since the delay time Td can accord with the delay time of a standard value Tdx as indicated in equation (6), if Tdx is designed in advance to be in a range of the desired system clock cycle as indicated in the equation (5), it is possible to regulate the delay time Td automatically in a desired range so that the equation (4) is satisfied and to perform a normal data transfer even if the delay time Td varies due to the deviations in the devices resulting from differences in manufacturing processes.

Figure 5:
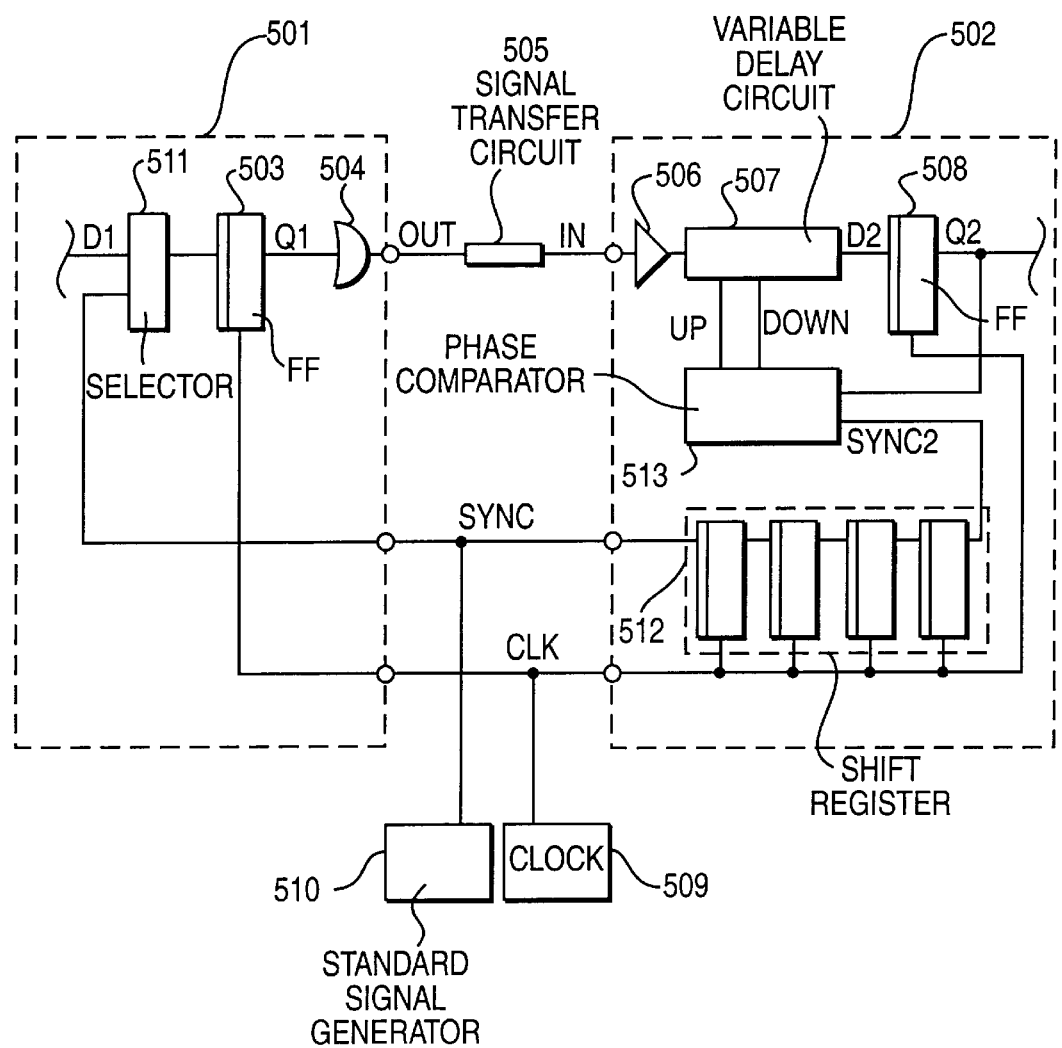
FIG. 5 is a diagram showing data signal transfer between logic circuits according to a third embodiment of the present invention.
Figure 6:
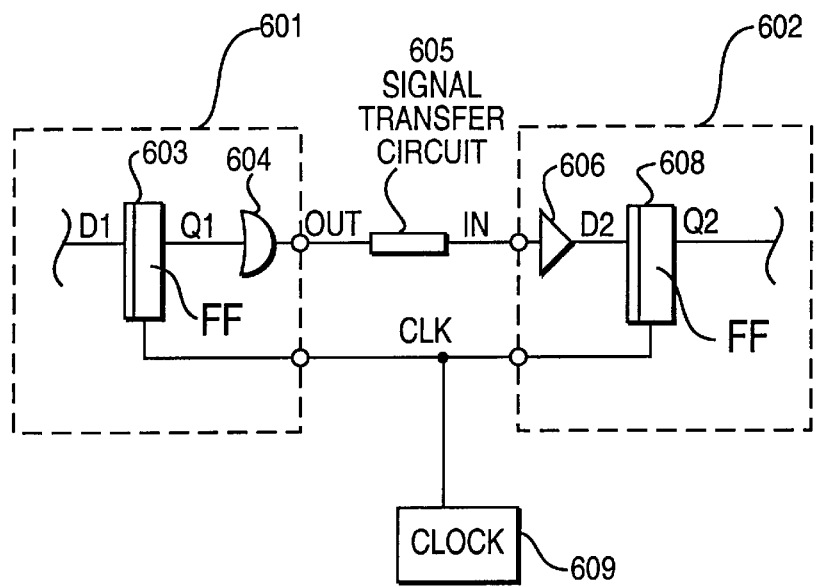
FIG. 6 is a diagram showing data signal transfer between logic circuits according to one example of the prior art.
Figure 7:
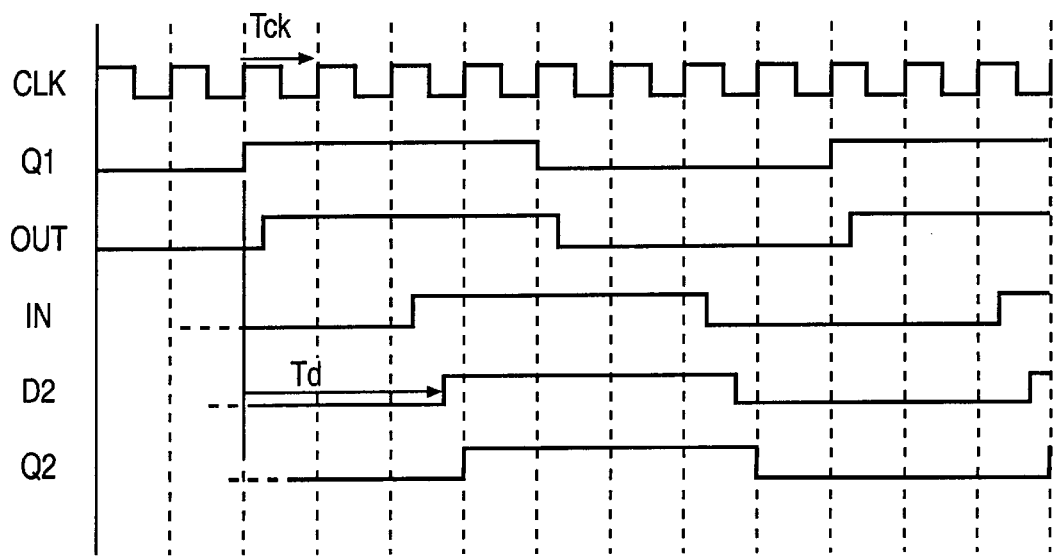
FIG. 7 is a timing chart of the data signal transfer shown in FIG. 6.
Figure 8:
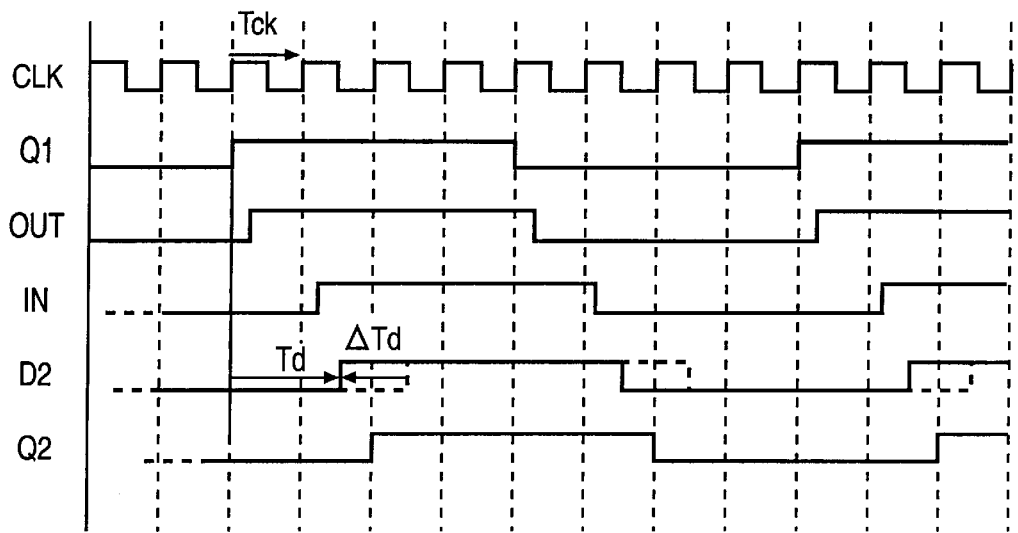
FIG. 8 is a timing chart of the data signal transfer shown in FIG. 6, further showing variation in the delay time of the data transfer.
Figure 9:
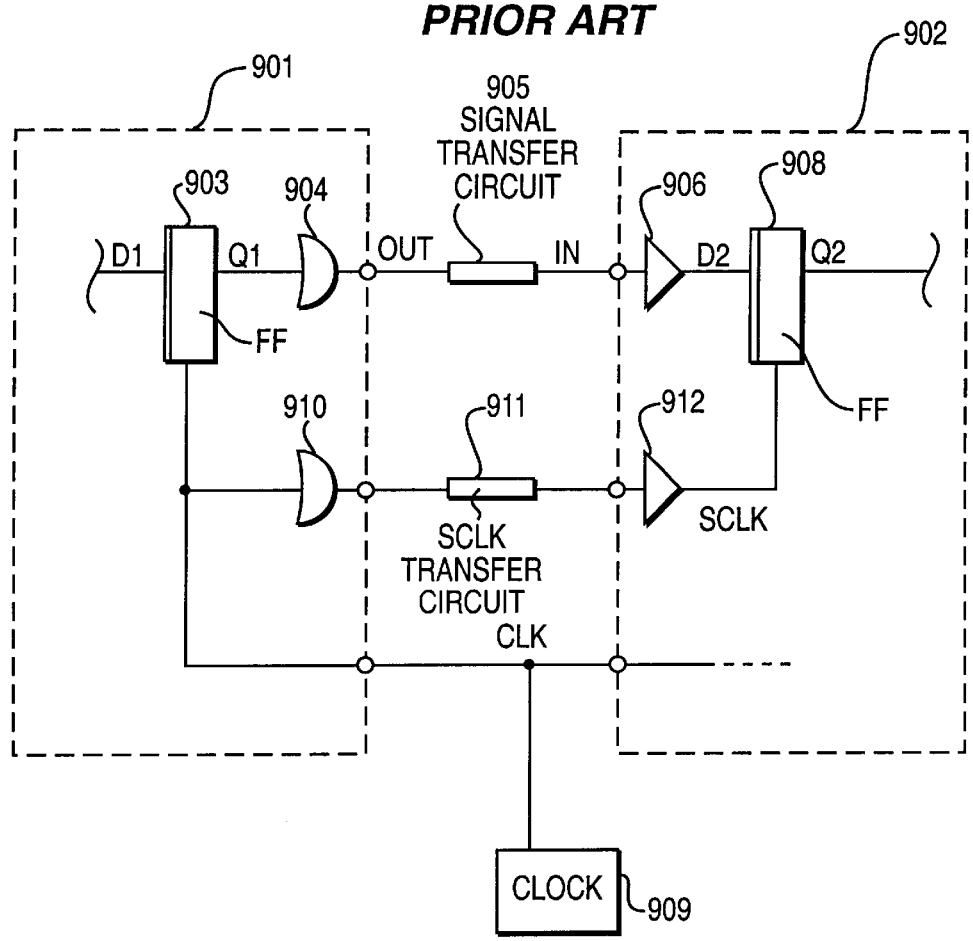
FIG. 9 is a diagram showing data signal transfer between logic circuits according to another example of the prior art using a parallel clock transfer method.
Figure 10:
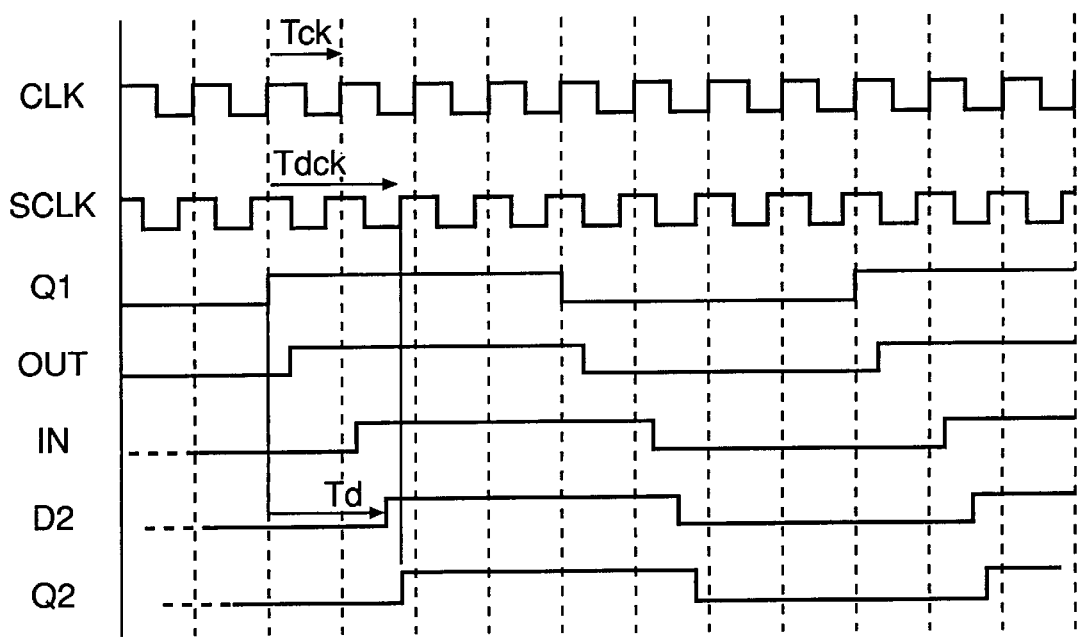
FIG. 10 is a timing chart of the data signal transfer shown in FIG. 9.

In the present invention, since the delay time of the standard value Tdx can be generated from the system clock signal CLK with high accuracy by using a shift register, as shown in FIG. 5, for a delay circuit 412 which delays signal SYNC or a test pattern signal by Tdx, it is possible to regulate the variation of the delay time Tdx in small increments. Consequently, the delay time Td can be regulated accurately in a desired range.

FIG. 5 shows a third embodiment of the present invention using such a shift register for the delay circuit. In this embodiment, a shift register for the delay circuit is used with a logic circuit 501 on the sending side and a logic circuit 502 on the receiving side. Preferably, circuits 501 and 502 are in the form of integrated circuits. Logic circuit 501 includes a flip-flop circuit 503 and a driver circuit for signal transfer. Logic circuit 502 includes a transferred signal input circuit 506, a variable delay circuit 507 that adjusts the delay time of the transferred signal and a flip-flop circuit 508. There is a signal transferring circuit 505 between the logic circuits 501 and 502. A system clock signal CLK is supplied from a common clock signal source 509 to the logic circuit 502 and the flip-flop circuit 508. Then, a signal is transferred in synchronism with the system clock signal.

According to the present invention as shown in FIG. 5, a standard signal SYNC2 is generated by shifting a common standard signal SYNC through logic circuit 502 to a delay circuit 512, which is a shift register. The system clock signal CLK is used as a clock signal for the shift register. In the embodiment of FIG. 5, a 4 stage register is used and a delay time of the standard value Tdx is set to 3Tck (three times a system clock signal cycle) based upon this embodiment. Other portions of the embodiment are the same as those shown in FIG. 1. The signal SYNC is distributed from a standard signal generator source 510 to the logic circuits 501 and 502. The signal SYNC given to the logic circuit 501 is applied through a selector circuit 511 to the flip-flop circuit 503. The signal SYNC given to the logic circuit 502 is applied through a shift register 512 to a phase comparator circuit 513 having one of input signals as the standard signal SYNC2. Then, the signal SYNC2 is compared with an output signal Q2 from the flip-flop circuit 508. A comparison result is given to control inputs UP or DOWN of the variable delay circuit 507.

The logic circuit in this embodiment operates as well as the logic circuit of the first embodiment shown in FIG. 1 does and the delay time Td can accord with the delay time of standard value Tdx as indicated in equation (6). Since Tdx can be designed accurately in advance in a range of the desired system clock cycle by using the shift register, it is possible to regulate the delay time Td automatically and accurately in a desired range so that equation (4) can be satisfied and to realize normal data transfer even if the delay time Td varies due to deviations in the delay times of the devices.

By providing the effectiveness of the present invention, even if the delay time of the data signal transfer varies due to deviations in the respective circuits, it is possible to provide a method for regulating the variation of the delay time automatically and to provide a logic circuit arrangement capable of performing data transfer in a range of a fixed system clock cycle.

While preferred embodiments have been set forth with specific details, further embodiments, modifications and variations are contemplated according to the broader aspects of the present invention, all as determined by the spirit and scope of the following claims.

We claim:

1. A circuit for regulating delay time of signal transmission of data signal on a signal path between a signal sending circuit included in a first logic circuit and a signal receiving circuit included in a second logic circuit, said circuit comprising:

a variable delay circuit inserted in said signal path;

a signal generator generating a standard signal;

connecting means for providing said standard signal to said signal sending circuit so that said standard signal is transferred to said signal receiving circuit through said signal path, instead of said data signal;

a phase comparator comparing a phase of a transferred standard signal which is transferred through said signal path with a phase of a reference signal which originates in said standard signal and is transferred to said phase comparator through an additional signal path; and adjusting means for adjusting delay time of said variable delay circuit in response to an output of said phase comparator so that a difference between the phase of said transferred standard signal and the phase of said reference signal becomes smaller.

2. The circuit according to claim 1, further comprising a delay circuit inserted in said additional signal path providing a standard delay to said reference signal.

3. The circuit according to claim 1, wherein said variable delay circuit, said phase comparator and said adjusting means are provided in said second logic circuit.

4. The circuit according to claim 1, wherein said signal sending circuit includes a first flip-flop circuit discriminating level of a signal to be sent in synchronism with a system clock signal and said signal receiving circuit includes a second flip-flop circuit discriminating level of signal transferred through said signal path in synchronism with said system clock signal.

5. The circuit according to claim 4, wherein said phase comparator compares an output signal of said second flip-flop circuit with said reference signal.

6. The circuit according to claim 4, further comprising a delay circuit, inserted in said additional signal path, formed of a shift register providing a standard delay to said reference signal by shifting said reference signal in synchronism with said system clock signal.

7. The circuit according to claim 1, wherein said signal generator comprises:

a timing signal generator deriving a timing signal indicating a start of regulating;

a first pattern generator generating said standard signal for providing to said signal sending circuit in response to said timing signal; and a second pattern generator generating said reference signal in response to said timing signal in response to said timing signal.

8. The circuit according to claim 7, wherein said first pattern generator is provided in said first logic circuit and said second pattern generator is provided in said second logic circuit.

* * * * *